United States Patent
Moriya et al.

(10) Patent No.: US 8,210,742 B2
(45) Date of Patent: Jul. 3, 2012

(54) METHOD AND APPARATUS FOR DETECTING FOREIGN MATTER ATTACHED TO PERIPHERAL EDGE OF SUBSTRATE, AND STORAGE MEDIUM

(75) Inventors: Tsuyoshi Moriya, Nirasaki (JP); Eiichi Nishimura, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 497 days.

(21) Appl. No.: 12/506,440

(22) Filed: Jul. 21, 2009

(65) Prior Publication Data
US 2010/0018332 A1      Jan. 28, 2010

(30) Foreign Application Priority Data
Jul. 22, 2008    (JP) ................................. 2008-189101

(51) Int. Cl.
*G01N 25/72* (2006.01)
*G01N 21/94* (2006.01)
*G01N 21/952* (2006.01)
*H01L 21/302* (2006.01)
*H01L 21/66* (2006.01)

(52) U.S. Cl. ........................................ 374/45; 356/237.3

(58) Field of Classification Search .................... 73/104, 73/865.6, 865.8–866; 250/559.41; 356/237.3–237.4; 374/45; 438/14, 16; 702/35
See application file for complete search history.

(56) References Cited

U.S. PATENT DOCUMENTS

| | | | | |
|---|---|---|---|---|
| 4,610,541 A | * | 9/1986 | Tanimoto et al. | .... 250/559.41 X |
| 4,669,875 A | * | 6/1987 | Shiba et al. | ................. 356/237.3 |
| 4,814,596 A | * | 3/1989 | Koizumi et al. | ...... 250/559.41 X |
| 4,967,095 A | * | 10/1990 | Berger et al. | ............ 250/559.41 |
| 6,433,339 B1 | * | 8/2002 | Maeda et al. | .......... 356/237.4 X |
| 8,061,224 B2 | * | 11/2011 | Zhao et al. | .................... 73/865.8 |
| 2007/0209591 A1 | | 9/2007 | Nagaike et al. | |
| 2010/0053602 A1 | * | 3/2010 | Hayashi et al. | ............ 356/237.3 |
| 2010/0118302 A1 | * | 5/2010 | Moriya et al. | .......... 73/865.8 X |

FOREIGN PATENT DOCUMENTS
JP      06138056 A   *  5/1994
JP      2000019135 A  *  1/2000
JP      2007-273947      10/2007

\* cited by examiner

*Primary Examiner* — Thomas P Noland
(74) *Attorney, Agent, or Firm* — Oblon, Spivak, McClelland, Maier & Neustadt, L.L.P.

(57) ABSTRACT

A foreign matter detecting method of detecting foreign matter attached to a peripheral edge of a substrate, which makes it possible to accurately detect foreign matter attached to the peripheral edge of the substrate even if the foreign matter is of a minute size below the detection limit of an existing measuring instrument, and which is highly versatile and suitable for mass production of substrates. The substrate is cooled to condense moisture around the foreign matter attached to the peripheral edge of the substrate, and then the condensed moisture is iced to grow an ice crystal. Then, the foreign matter attached to the peripheral edge of the substrate, which is emphasized by the ice crystal, is detected.

5 Claims, 5 Drawing Sheets

METHOD AND APPARATUS FOR DETECTING FOREIGN MATTER ATTACHED TO PERIPHERAL EDGE OF SUBSTRATE, AND STORAGE MEDIUM

BACKGROUND OF THE INVENTION

1. Field of the Invention

The present invention relates to a method and apparatus for detecting foreign matter attached to a peripheral edge of a substrate, as well as a storage medium, and in particular to a method and apparatus for detecting foreign matter attached to a peripheral edge of a substrate, which detects foreign matter such as a polymer attached to a peripheral edge of a substrate by carrying out preliminary processing to emphasize the foreign matter and then checking the peripheral edge of the substrate, as well as a storage medium.

2. Description of the Related Art

There may be cases where a polymer as foreign matter becomes attached to an edge face and its surrounding oblique portion (hereinafter referred to as a "peripheral edge" or "bevel portion") of, for example, a wafer as a semiconductor substrate that has been subjected to etching processing and so on, and in general, such a polymer is called a bevel polymer. For example, the bevel polymer rubs against a transfer arm, a wafer cassette, or the like to become minute foreign matter (particle) when a wafer is being transferred, and also, in an immersion exposure process, the bevel polymer is, for example, spread over a surface of the wafer to cause defects, resulting in adversely affecting the quality of semiconductor devices.

Examples of publications describing prior arts related to a method or an apparatus for detecting such foreign matter attached to a semiconductor substrate include Japanese Laid-open Patent Publication (Kokai) No. 2007-273947.

In Japanese Laid-open Patent Publication (Kokai) No. 2007-273947, a substrate surface checking method is described in which a wafer W to which a particle P having a particle diameter of about 30 μm is attached is rapidly cooled to, for example, −20° C. or less so as to bring moisture in an atmosphere surrounding the wafer W into a supercooled state, the supercooled water is made to become attached to a periphery of the particle P on the surface of the wafer W, then the supercooled water is released from the supercooled state and thus coagulated to grow into an ice crystal around the particle P, and the particle P on the surface of the wafer W is indirectly detected by detecting the ice crystal.

According to the invention described in Japanese Laid-open Patent Publication (Kokai) No. 2007-273947, the ice crystal is grown around the particle of a minute size below the detection limit of a measuring instrument so as to increase the apparent size of the particle, and the particle P is indirectly detected by detecting the ice crystal, but no mention is made of how to detect a so-called bevel polymer attached to a peripheral edge of a substrate, which is an object of the present invention.

Here, a technique to remove a bevel polymer using, for example, ozone or laser light is under research or development, but not only management of the bevel polymer but also detection itself of the bevel polymer is difficult because the bevel polymer is of a minute size, and a peripheral edge of a substrate to which the bevel polymer is attached is a curved surface, and an effective bevel polymer detecting method has thus not been established.

SUMMARY OF THE INVENTION

The present invention provides a method and apparatus for detecting foreign matter attached to a peripheral edge of a substrate, which make it possible to accurately detect foreign matter attached to the peripheral edge of the substrate even if the foreign matter is of a minute size below the detection limit of an existing measuring instrument, and which are highly versatile and suitable for mass production of substrates, as well as a storage medium.

Accordingly, in a first aspect of the present invention, there is provided a foreign matter detecting method of detecting foreign matter attached to a peripheral edge of a substrate, comprising a cooling step of cooling the substrate to condense moisture around foreign matter attached to the peripheral edge of the substrate, and then icing the condensed moisture to grow an ice crystal and a peripheral edge checking step of detecting the foreign matter attached to the peripheral edge of the substrate, which is emphasized by the ice crystal.

According to the first aspect of the present invention, because the foreign matter detecting method is comprised of the cooling step of cooling the substrate to condense moisture around foreign matter attached to the peripheral edge of the substrate, and then icing the condensed moisture to grow an ice crystal, and the peripheral edge checking step of detecting the foreign matter attached to the peripheral edge of the substrate, which is emphasized by the ice crystal, the foreign matter attached to the peripheral edge of the substrate can be accurately detected even if the foreign matter is of a minute size below the detection limit of an existing measuring instrument. Moreover, this foreign matter detecting method is highly versatile and suitable for checking substrates at the time of mass production.

The first aspect of the present invention can provide a foreign matter detecting method of detecting foreign matter attached to a peripheral edge of a substrate, wherein the cooling step comprises cooling the peripheral edge of the substrate to −15° C. or less, and controlling a relative humidity in an atmosphere surrounding the peripheral edge of the substrate at 23° C. to 10% or less.

According to the first aspect of the present invention, because the cooling step is a step of cooling the peripheral edge of the substrate to −15° C. or less, and controlling the relative humidity in an atmosphere surrounding the peripheral edge of the substrate at 23° C. to 10% or less, the ice crystal formed using moisture in the atmosphere grows to a large extent due to an enhanced supercooled state, and as a result, the foreign matter attached to the peripheral edge of the substrate can be emphasized to be detected.

The first aspect of the present invention can provide a foreign matter detecting method of detecting foreign matter attached to a peripheral edge of a substrate, wherein the cooling step comprises maintaining the moisture in a supercooled state, and providing control such that a water vapor pressure in an atmosphere surrounding the peripheral edge of the substrate is not more than a saturated vapor pressure at which moisture in a vapor phase condenses on the peripheral edge of the substrate even if no foreign matter is attached to the peripheral edge of the substrate, and not less than a saturated vapor pressure at which moisture in a vapor phase condenses on the peripheral edge of the substrate if foreign matter is attached to the peripheral edge of the substrate.

According to the first aspect of the present invention, because in the cooling step, the moisture is maintained in a supercooled state, and the water vapor pressure in an atmosphere surrounding the peripheral edge of the substrate is controlled to be not more than a saturated vapor pressure at which moisture in a vapor phase condenses on the peripheral edge of the substrate even if no foreign matter is attached to the peripheral edge of the substrate, and not less than a saturated vapor pressure at which moisture in a vapor phase condenses on the peripheral edge of the substrate if foreign matter is attached to the peripheral edge of the substrate, the ice crystal can be formed around the foreign matter attached to the peripheral edge of the substrate and three-dimensionally grown in a specific supercooled state. As a result of this, the foreign matter attached to the peripheral edge of the substrate can be emphasized to be accurately detected.

The first aspect of the present invention can provide a foreign matter detecting method of detecting foreign matter attached to a peripheral edge of a substrate, wherein the ice crystal undergoes a vapor-phase growth.

According to the first aspect of the present invention, because the ice crystal undergoes a vapor-phase growth, there is no need to form a water film in advance, and the ice crystal can be grown using moisture in the atmosphere.

The first aspect of the present invention can provide a foreign matter detecting method of detecting foreign matter attached to a peripheral edge of a substrate, comprising an ice crystal immobilizing step of, prior to the peripheral edge checking step, causing a component that reacts with water molecules and becomes solidified to act on the ice crystal so that the ice crystal is immobilized.

According to the first aspect of the present invention, because the foreign matter detecting method is comprised of the ice crystal immobilizing step of, prior to the peripheral edge checking step, causing a component that reacts with water molecules to become immobilized to act on the ice crystal so that the ice crystal is immobilized, the subsequent peripheral edge checking step can be made easier, and the need to manage the atmosphere in the peripheral edge checking step can be eliminated.

Accordingly, in a second aspect of the present invention, there is provided a foreign matter detecting apparatus that detects foreign matter attached to a peripheral edge of a substrate, comprising a peripheral edge processing unit that has an accommodating chamber in which the substrate is accommodated, and carries out preliminary processing on the peripheral edge of the substrate and a peripheral edge checking unit that checks the peripheral edge of the substrate on which the preliminary processing has been carried out, wherein the peripheral edge processing unit comprises a cooling unit that cools the peripheral edge of the substrate to not more than −15° C. nor less than −30° C. and a humidity adjusting unit that adjusts a water vapor pressure in the accommodating chamber so that the water vapor pressure is not more than a saturated vapor pressure at which moisture in a vapor phase condenses on the peripheral edge of the substrate even if no foreign matter is attached to the peripheral edge of the substrate, and not less than a saturated vapor pressure at which moisture in a vapor phase condenses on the peripheral edge of the substrate if foreign matter is attached to the peripheral edge of the substrate.

According to the second aspect of the present invention, because the peripheral edge processing unit is comprised of the cooling unit that cools the peripheral edge of the substrate to not more than −15° C. nor less than −30° C., and the humidity adjusting unit that adjusts the water vapor pressure in the accommodating chamber such that the water vapor pressure is not more than a saturated vapor pressure at which moisture in a vapor phase condenses on the peripheral edge of the substrate even if no foreign matter is attached to the peripheral edge of the substrate, and not less than a saturated vapor pressure at which moisture in a vapor phase condenses on the peripheral edge of the substrate if foreign matter is attached to the peripheral edge of the substrate, the foreign matter attached to the peripheral edge of the substrate can be accurately detected even if the foreign matter is of a minute size below the detection limit of an existing measuring instrument. Moreover, this foreign matter detecting apparatus is highly versatile and suitable for checking substrates at the time of mass production.

Accordingly, in a third aspect of the present invention, there is provided a computer-readable storage medium storing a program for causing a computer to implement a foreign matter detecting method of detecting foreign matter attached to a peripheral edge of a substrate, the foreign matter detecting method of detecting foreign matter attached to the peripheral edge of the substrate comprising a cooling step of cooling the substrate to condense moisture around foreign matter attached to the peripheral edge of the substrate, and then icing the condensed moisture to grow an ice crystal and a peripheral edge checking step of detecting the foreign matter attached to the peripheral edge of the substrate, which is emphasized by the ice crystal.

The features and advantages of the invention will become more apparent from the following detailed description taken in conjunction with the accompanying drawings.

DETAILED DESCRIPTION OF PREFERRED EMBODIMENTS

The present inventors conducted various studies on how to detect a bevel polymer as foreign matter attached to a bevel portion of a substrate, and came up with the idea that if the bevel polymer can be enlarged or emphasized, it will become possible to detect the bevel polymer using an existing measuring instrument such as an optical microscope, an electron microscope, or a laser light scattering method. Based on this idea, the present inventors eagerly carried out research so as to find a method of enlarging or emphasizing the bevel polymer, a method of detecting the bevel polymer, and so on. As a result, the present inventors found that by cooling the substrate in a predetermined atmosphere, moisture in a vapor phase surrounding the peripheral edge of the substrate or the bevel polymer condenses around the bevel polymer, then an ice crystal is formed around the bevel polymer and emphasizes the bevel polymer such as to stand out the bevel polymer in appearance, and the ice crystal grown around the bevel polymer can be satisfactorily detected using an existing measuring instrument, and arrived at the present invention.

The present invention will now be described in detail with reference to the drawings showing a preferred embodiment thereof.

First, a description will be given of a substrate processing system including a foreign matter detecting apparatus that detects foreign matter attached to a peripheral edge of a substrate according to the present invention, which is applied to implementation of a foreign matter detecting method of detecting foreign matter attached to a peripheral edge of a substrate according to the present invention.

Figure 1:
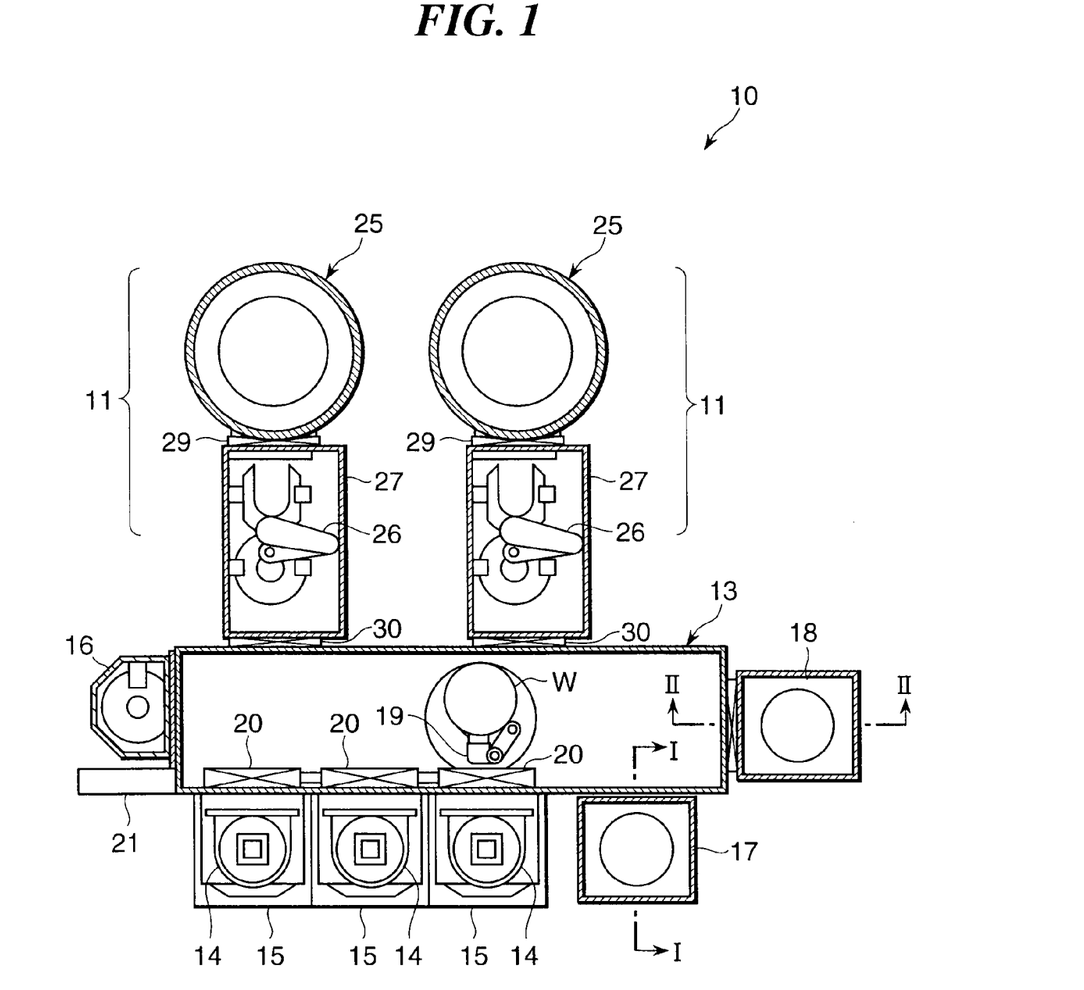
FIG. 1 is a plan view schematically showing the construction of a substrate processing system including an apparatus that detects foreign matter attached to a peripheral edge of a substrate according to the present invention.

FIG. 1 is a plan view schematically showing the construction of the substrate processing system including the foreign matter detecting apparatus that detects foreign matter attached to a peripheral edge of a substrate according to the present invention.

Referring to FIG. 1, the substrate processing system 10 is comprised mainly of two process ships 11 that carry out reactive ion etching (hereinafter referred to as the "RIE") processing or the like on, for example, wafers W for semiconductor devices (hereinafter referred to merely as "wafers W"), a loader module 13 as a common rectangular transfer chamber to which the two process ships 11 are connected, and a peripheral edge processing unit 17 and a peripheral edge checking unit 18 each of which connected to the loader module 13.

To the loader module 13 are connected three FOUP (front opening unified pod) mounting stages 15 on each of which a FOUP 14 as a container in which, for example, 25 wafers W are accommodated is mounted, and an orienter 16 that pre-aligns the position of a wafer W transferred out from the FOUP 14. It should be noted that from a functional standpoint, a part comprised of the peripheral edge processing unit 17 and the peripheral edge checking unit 18 is referred to as the foreign matter detecting apparatus that detects foreign matter attached to a peripheral edge of a substrate.

The two process ships 11 are connected to one side wall of the loader module 13 in the longitudinal direction thereof and disposed such as to face, for example, the three FOUP mounting stages 15 disposed on the other side wall of the loader module 13 in the longitudinal direction thereof. The orienter 16 is disposed at one end of the loader module 13 in the longitudinal direction thereof, the peripheral edge checking unit 18 is disposed at the other end of the loader module 13 in the longitudinal direction thereof, and the peripheral edge processing unit 17 is disposed on the other side wall of the loader module 13 in the longitudinal direction thereof and parallel to the FOUP mounting stages 15.

The loader module 13 has therein a SCARA-type dual-arm transfer arm mechanism 19 for transferring wafers W, and has on the other side wall thereof, for example, three load ports 20 that are disposed correspondingly to the respective FOUP mounting stages 15 and through which wafers W are loaded. The transfer arm mechanism 19 removes each wafer W from the FOUPs 14 mounted on the FOUP mounting stages 15 via the load ports 20 and transfers the removed wafer W into and from the process ships 11, the orienter 16, the peripheral edge processing unit 17, or the peripheral edge checking unit 18.

Each of the process ships 11 has a process module 25 as a plasma processing chamber in which a wafer W is subjected to the RIE processing, and a load-lock module 27 that has therein a link-type single pick transfer arm 26 that transfers wafers W to the process module 25.

The interior of the loader module 13 is maintained at atmospheric pressure, and on the other hand, the interior of the process module 25 is maintained in a vacuum. Thus, the load-lock module 27 of each process ship 11 has a vacuum gate valve 29 at a location joined to the process module 25, and has an atmospheric gate valve 30 at a location joined to the loader module 13. Thus, the load-lock module 27 acts as a vacuum preliminary transfer chamber of which inner pressure is adjustable.

The substrate processing system 10 has a system controller (not shown) that controls operation of the process ships 11 including the process modules 25 and the load-lock modules 27, the loader module 13, the orienter 16, and the foreign matter detecting apparatus that detects foreign matter attached to a peripheral edge of a substrate, which is comprised of the peripheral edge processing unit 17 and the peripheral edge checking unit 18, and an operation panel 21 that is disposed at one end of the loader module 13 in the longitudinal direction thereof.

The system controller controls operation of the component elements in accordance with a recipe as a program for implementing the RIE processing. The operation panel 21 has a display unit (not shown) comprised of, for example, an LCD (liquid crystal display), and the display unit displays operating states of the component elements.

Figure 2:
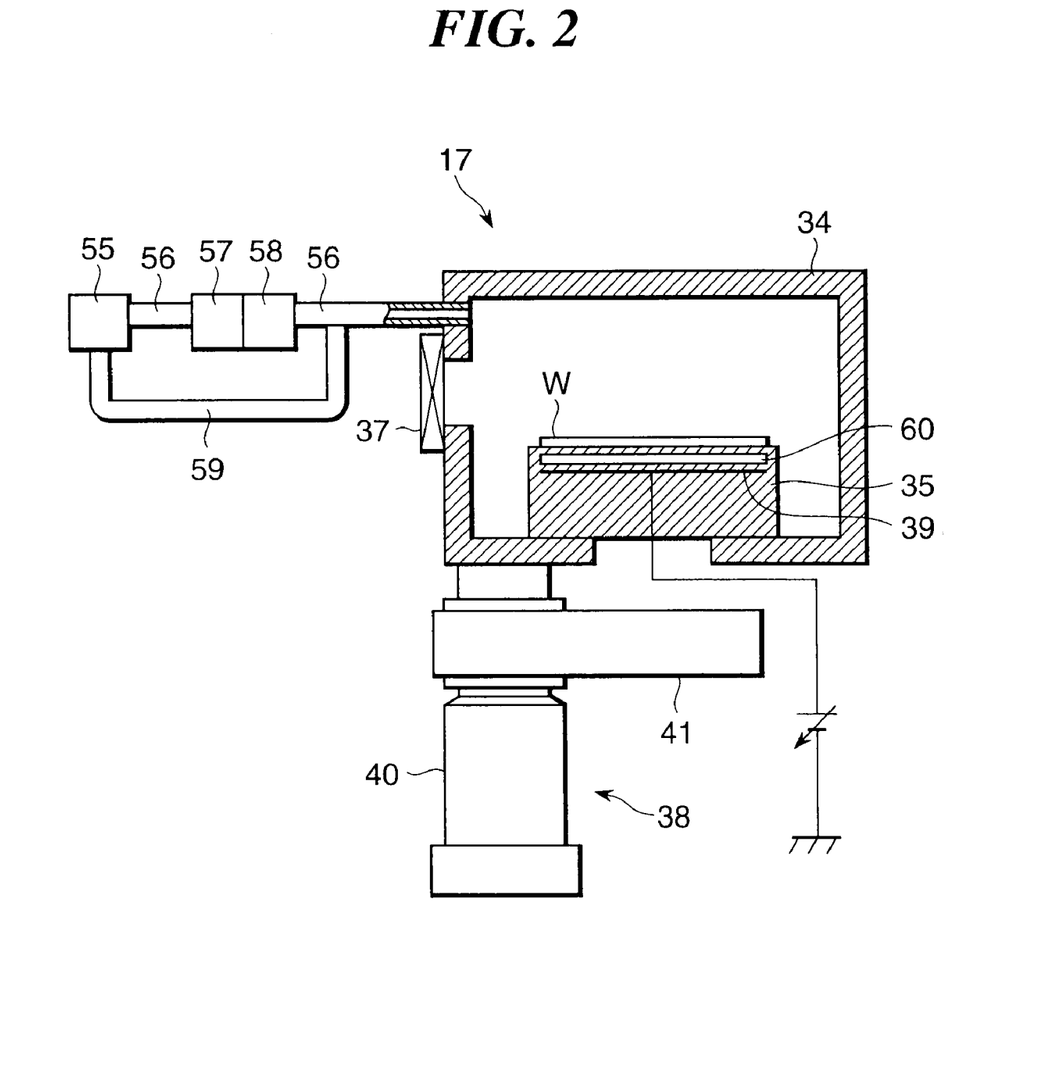
FIG. 2 is a cross-sectional view taken along line I-I in FIG. 1.

FIG. 2 is a cross-sectional view taken along line I-I in FIG. 1. It should be noted that in the following description referring to FIG. 2, an upper part as viewed in the figure is referred to as the "upper side", and a lower part as viewed in the figure is referred to as the "lower side" for the sake of convenience.

Referring to FIG. 2, the peripheral edge processing unit 17 has a box-shaped accommodating chamber 34, a wafer stage 35 that is disposed on the lower side in the accommodating chamber 34 and on which a wafer W is mounted, an openable and closable gate valve 37 that is disposed on a side of the accommodating chamber 34, and an exhausting unit 38 that exhausts a fluid from the accommodating chamber 34. The peripheral edge processing unit 17 is connected to the loader module 13 via the gate valve 37, and the interior of the accommodating chamber 34 is brought into communication with the interior of the loader module 13 when the gate valve 37 is opened.

The wafer stage 35 has therein a heater 39 that is disposed below a mounting surface for the wafer W and comprised of an electrically-heated wire or the like. The heater 39 heats the wafer W mounted on the wafer stage 35 to a desired temperature. The wafer stage 35 also has therein, for example, a Peltier device 60 as a cooling unit for cooling the wafer W. The Peltier device 60 cools the wafer W mounted on the wafer stage 35 to a desired temperature. A Peltier device is a kind of electronic components, and is a plate-shaped semiconductor device using a Peltier effect of passing a current through a junction between two kinds of metals and thereby shifting heat from one metal to the other metal. When a current is passed through a junction between two kinds of metals, one surface absorbs heat, and the other surface evolves heat. The heat-absorbing surface acts as a cooling surface, and the heat-evolving surface acts as a heating surface. If the polarity of the current is reversed, the cooling surface and the heating surface are inverted, so that temperature can be controlled with high accuracy. Although in the present embodiment, the wafer stage 35 cools the wafer W using the Peltier device 60 and heats the wafer W using the heater 39, the Peltier device 60 may cool and heat the wafer W.

The exhausting unit 38 has a TMP (turbo-molecular pump) 40 that exhausts gas or the like from the accommodating chamber 34, a DP (dry pump) (not shown) disposed on the exhausting side of the TMP 40, and a pressure control valve 41 that is disposed between the accommodating chamber 34 and the TMP 40. The pressure control valve 41 controls the pressure in the accommodating chamber 34 to a desired pressure.

The accommodating chamber 34 is equipped with a humidity adjusting unit that adjusts the humidity inside the internal space of the accommodating chamber 34. The humidity adjusting unit is comprised mainly of a storage tank 55 for nitrogen gas as a moisture transfer medium, a nitrogen piping 56 that connects the nitrogen gas storage tank 55 and the accommodating chamber 34 together, a humidifier 57 and a thermostatic chamber 58 disposed in this order in the nitrogen piping 56, and a bypass piping 59 that bypasses the humidifier 57 and the thermostatic chamber 58. Each of the nitrogen piping 56 and the bypass piping 59 is equipped with a regulator for pressure regulation (not shown). To humidify the interior of the accommodating chamber 34, a predetermined amount of nitrogen gas containing predetermined moisture is introduced from the nitrogen gas storage tank 55 into the accommodating chamber 34 via the humidifier 57 and the thermostatic chamber 58. At this time, the humidity in the accommodating chamber 34 is measured and controlled using a hygrometer, not shown. The interior of the accommodating chamber 34 is evacuated to a substantially vacuum state by the exhausting unit 38.

The peripheral edge processing unit 17 carries out pre-checking processing, described later, on the wafer W that has been transferred into the peripheral edge checking unit 18 and on which peripheral edge checking is to be carried out.

Figure 3:
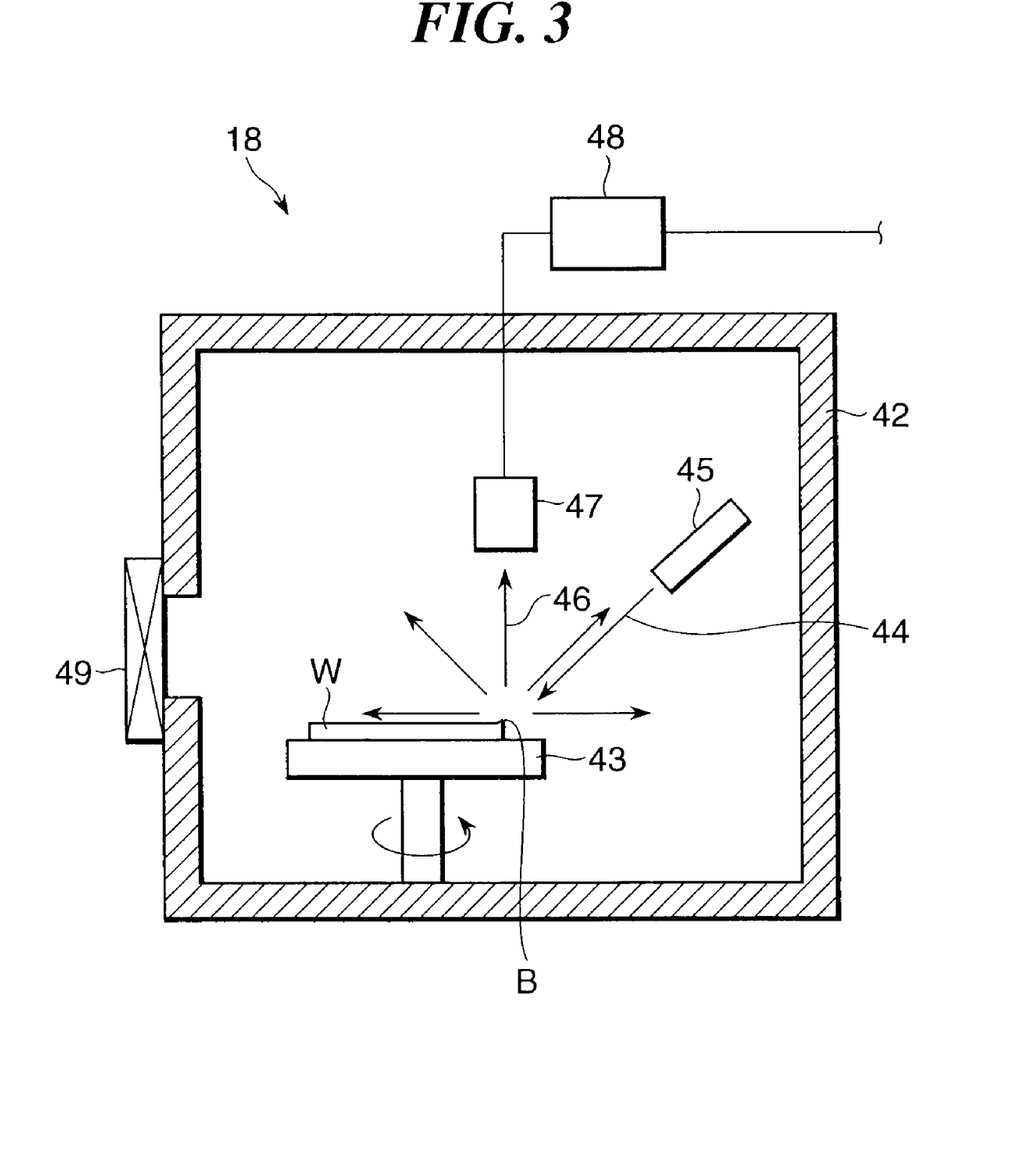
FIG. 3 is a cross-sectional view taken along line II-II in FIG. 1.

FIG. 3 is a cross-sectional view taken along line II-II in FIG. 1. It should be noted that in the following description referring to FIG. 3, an upper part as viewed in the figure is referred to as the "upper side", and a lower part as viewed in the figure is referred to as the "lower side" for the sake of convenience.

Referring to FIG. 3, the peripheral edge checking unit 18 has a box-shaped accommodating chamber 42, a wafer stage (mounting stage) 43 that is disposed on the lower side in the accommodating chamber 42 and on which a wafer W is mounted, a laser light irradiating unit 45 that irradiates the peripheral edge of the rotating wafer W with laser light 44, a light-receiving unit (collimator) 47 that receives part of scattered light 46 from the peripheral edge of the wafer W irradiated with the laser light 44, a photoelectric converter (photomultiplier) 48 that converts the scattered light received by the light-receiving unit 47 into an electric signal, and an openable and closable gate valve 49 that is disposed on a side of the accommodating chamber 42. The photoelectric converter 48 is connected to the system controller, not shown.

The peripheral edge checking unit 18 is connected to the loader module 13 via the gate valve 49 (see FIG. 1), and the interior of the accommodating chamber 42 is brought into communication with the interior of the loader module 13 when the gate valve 49 is opened.

In the peripheral edge checking unit 18, if there is a bevel polymer B attached to the peripheral edge of the wafer W mounted on the wafer stage 43, the scattered light 46 is produced when the bevel polymer B is irradiated with the laser light 44. Part of the scattered light 46 is received by the light-receiving unit 47 and further converted into an electric signal by the photoelectric converter 48, and the electric signal is sent to the system controller. The intensity of the scattered light 46 varies according to the size of the bevel polymer B, and hence the system controller detects the presence and size of the bevel polymer B based on the voltage value of the electric signal corresponding to the intensity of the scattered light 46.

Next, a description will be given of the foreign matter detecting method that uses the foreign matter detecting apparatus that detects foreign matter attached to a peripheral edge of a substrate according to the present invention.

The method of detecting foreign matter attached to a peripheral edge of a substrate according to the present invention is a method in which the apparent size of a bevel polymer attached to a peripheral edge of a wafer W as an object to be checked is increased, and the bevel polymer is indirectly detected using an existing measuring instrument.

A description will now be given of the foreign matter detecting method of detecting foreign matter attached to a peripheral edge of a substrate according to the embodiment of the present invention with reference to the drawings. FIGS. 4A, 4B, 4C, and 4D are process drawings of substrate peripheral edge processing before checking, and substrate peripheral edge checking processing after a preliminary processing step.

In the present embodiment, a bevel polymer B attached to the peripheral edge of the substrate is detected as described below.

Figure 4A:
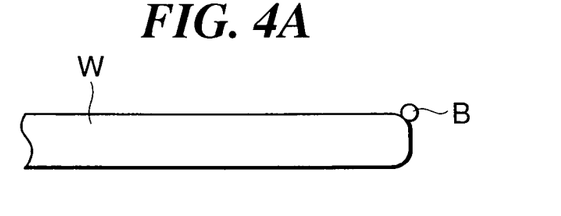
FIGS. 4A, 4B, 4C, and 4D are process drawings of a substrate peripheral edge processing before checking, and substrate peripheral edge checking processing after a preliminary processing step.
Figure 4B:
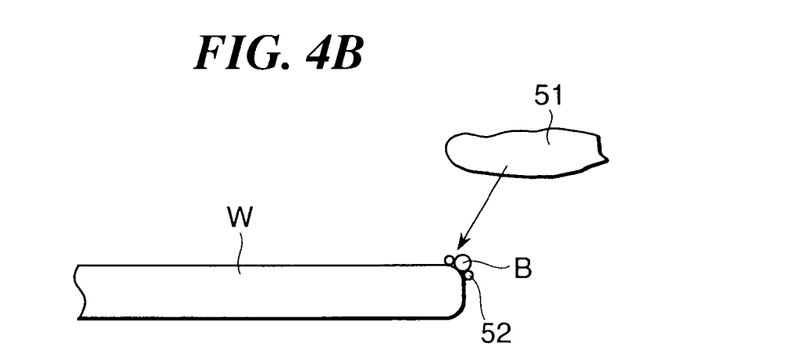
Figure 4C:
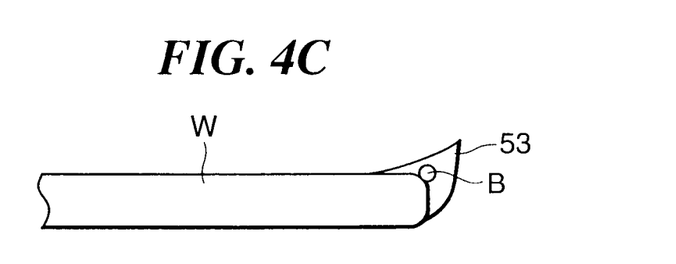

Specifically, first, a wafer W as an object to be checked is transferred into the accommodating chamber 34 of the peripheral edge processing unit 17 (see FIG. 2) by the transfer arm mechanism 19 (see FIG. 1) and mounted on the wafer stage 35. Then, the wafer W with the bevel polymer B attached thereto (FIG. 4A) is cooled to −20° C. or less, for example, −25° C. by a cooling unit, not shown (cooling step). At this time, the relative humidity in the accommodating chamber 34 at 23° C. is made to become 10% or less, for example, 2.9%. As a result, moisture attached to the peripheral edge of the wafer W or water vapor 51 existing in a vapor phase surrounding the peripheral edge of the wafer W condenses around the bevel polymer B to become condensed water 52 (FIG. 4B). The condensed water 52 is further cooled to form an ice crystal 53 around the bevel polymer B, and the ice crystal 53 captures moisture in the vapor phase to grow three-dimensionally like frost (FIG. 4C). In this way, the apparent size of the bevel polymer B is increased, and the presence thereof is emphasized. The ice crystal, however, has only to project from the peripheral edge of the wafer W and emphasize the bevel polymer B as foreign matter, and the direction of a vapor-phase growth is not particularly limited.

Figure 4D:
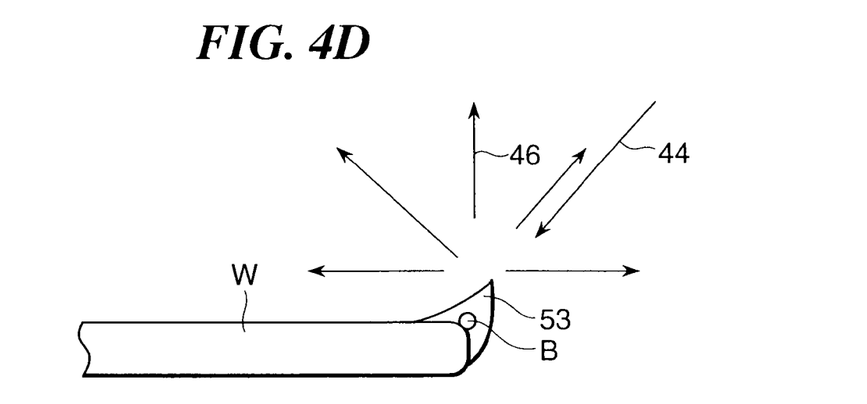

Then, the wafer W on which the ice crystal has grown around the bevel polymer B is transferred out from the peripheral edge processing unit 17, transferred into the accommodating chamber 42 of the peripheral edge checking unit 18, and mounted on the wafer stage 43. Then, the peripheral edge of the wafer W is irradiated with the laser light 44 by the laser light irradiating unit 45 while the wafer stage 43 is being rotated. At this time, because the ice crystal 53 is formed on the peripheral edge of the wafer W such as to cover the bevel polymer B, the laser light 44 scatters widely due to the ice crystal 53 that has increased the apparent size of the bevel polymer B on the wafer W, so that scattered light 46 with high intensity is produced (FIG. 4D). Thus, as compared with the case that there is only the bevel polymer B, the quantity of scattered light 46 received by the light-receiving unit 47 is significantly increases, and also, the voltage value of the electric signal produced through the conversion by the photoelectric converter 48 becomes larger. As a result, the presence of the bevel polymer B can be detected with ease (peripheral edge checking step).

According to the present embodiment, because the ice crystal 53 projecting three-dimensionally around the bevel polymer B from the peripheral edge of the wafer W is grown using moisture existing in the vapor phase in the accommodating chamber 34 of the peripheral edge processing unit 17, whereby the bevel polymer B can be enlarged and emphasized, the bevel polymer B can be indirectly detected using an existing measuring instrument such as an optical foreign matter checking unit, so that the contamination state of the peripheral edge of the wafer W can be measured. Moreover, after the bevel polymer B is detected, the ice crystal can be made to disappear by, for example, irradiating the same with an EB (electron beam), and then the particle diameter and so on of the bevel polymer B can be accurately measured using, for example, an SEM (scanning electron microscope) Thus, even an object to be checked does not lose its product's value due to the peripheral edge checking itself.

The foreign matter detecting method of detecting foreign matter attached to a peripheral edge of a substrate according to the present embodiment is highly versatile and suitable for mass production of wafers W because the bevel polymer B can be quickly detected using an existing measuring instrument. Thus, a wafer W with the bevel polymer B still attached thereto can be prevented from flowing to the next step and bringing about a decrease in the yield of products.

The growing stage of the ice crystal varies according to the size of the bevel polymer B. The larger the particle diameter of the bevel polymer B is, the larger is the degree to which the ice crystal grows. For this reason, the bevel polymer B can be measured by measuring the number of formed ice crystals and the size and height of the crystals. At this time, because the growth of the ice crystal does not depend on the material of a wafer W, the surface roughness can be detected irrespective of the presence or absence of a film such as an oxide film, the type of an underlayer, and so on.

In the present embodiment, environmental conditions for growing the ice crystal around the bevel polymer B are preferably, for example, that the temperature of the peripheral edge of the wafer W is not more than −15° C. nor less than −30° C., the relative humidity in the accommodating chamber 34 at 23° C. (300 K) is not more than 10% nor less than 1.5%, and more preferably that the temperature of the peripheral edge of the wafer W is not more than −23° C. nor less than −28° C., and the water vapor pressure in an atmosphere surrounding the wafer W lies in a state between a state in which moisture in a vapor phase condenses on the peripheral edge of the wafer W even if the bevel polymer B is not attached to the peripheral edge of the wafer W (hereinafter referred to as the "saturated vapor pressure in the case that there is no bevel polymer attached") and a state in which moisture in a vapor phase condenses around the bevel polymer B in the case that the bevel polymer B is attached to the peripheral edge of the wafer W (hereinafter referred to as the "saturated vapor pressure in the case that there is the bevel polymer attached").

Figure 5:
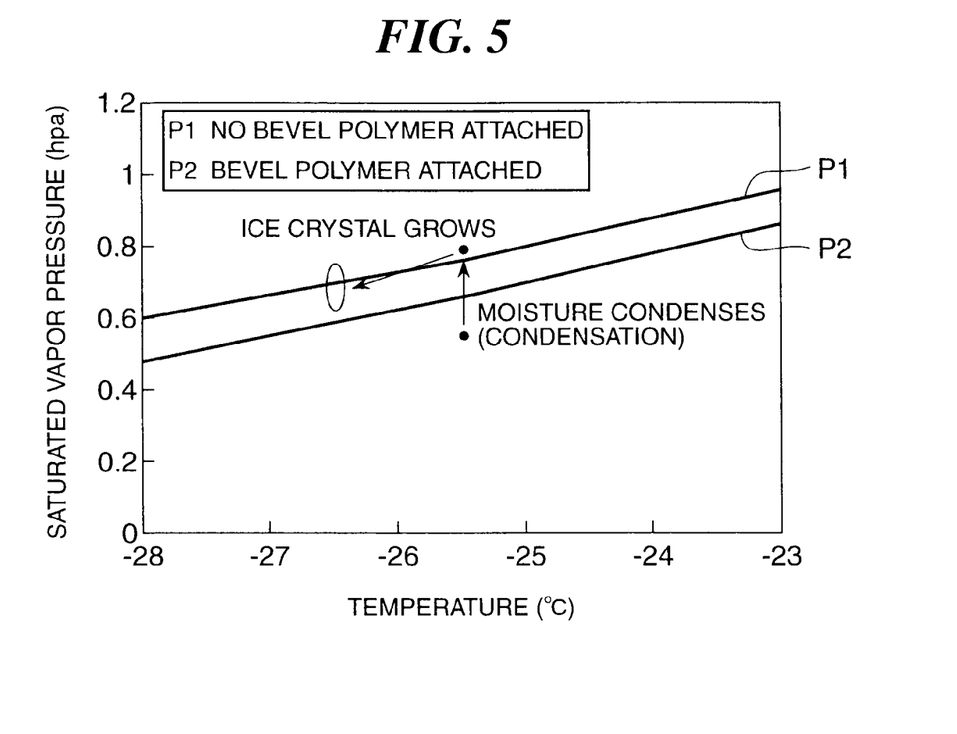
FIG. 5 is a view showing a saturated vapor pressure curve in the case that there is no bevel polymer attached and a saturated vapor pressure curve in the case that there is a bevel polymer attached when the temperature of a substrate is not more than −23° C. nor less than −30° C.

FIG. 5 is a view showing a curve of the saturated vapor pressure in the case that there is no bevel polymer attached and a curve of the saturated vapor pressure in the case that there is the bevel polymer attached when the temperature of the substrate is not more than −23° C. nor less than −30° C. Referring to FIG. 5, a vapor pressure curve P1 indicates the curve of the saturated vapor pressure in the case that there is no bevel polymer attached, and a vapor pressure curve P2 indicates the curve of the saturated vapor pressure in the case that there is the bevel polymer attached. As is clear from the drawing, in a state between the vapor pressure curve P1 and the vapor pressure curve P2, the condensation of moisture does not proceed in an area except the bevel polymer B on the peripheral edge of the wafer W, and the ice crystal suitably grows around the bevel polymer B on the peripheral edge of the wafer W to increase the apparent size of the bevel polymer B to a size of, for example, not less than 40 nm, which is the detection limit of an existing measuring instrument, and emphasize the bevel polymer B. Thus, the bevel polymer B can be satisfactorily detected using an existing measuring instrument.

In the present embodiment, after the ice crystal is grown around the bevel polymer B, the ice crystal may be immobilized by spraying a component that immobilizes the ice crystal. By immobilizing the ice crystal formed around the bevel polymer B, the subsequent peripheral edge checking step can be made easier, and for example, a cooling unit in the accommodating chamber 42 or the wafer stage 43 in the peripheral edge checking unit 18 can be dispensed with.

Examples of the component that immobilizes the ice crystal include gaseous cyanoacrylate. Specifically, the following chemical reaction is used:

The cyanoacrylate reacts with moisture, polymerizes, and hardens into poly cyanoacrylate. The formed poly cyanoacrylate as solid matter does not evaporate when being exposed to the atmosphere. That is, the ice-crystalline solid matter remains on the peripheral edge of the wafer W. The solid matter scatters the laser light 44, and hence the scattered light 46 can be increased. Thus, by detecting the solid matter, the bevel polymer B on the wafer W can be detected with ease.

A gas that reacts with moisture to produce solid matter is obtained by gasifying a cyanoacrylate-based solvent. It should be noted that the cyanoacrylate-based solvent is a mixture of a base compound that is any of alkyl cyanoacrylates such as ethyl cyanoacrylate, octyl cyanoacrylate, butyl cyanoacrylate, and methoxyethyl cyanoacrylate, and a diluent that is any of ketones.

Figure 6:
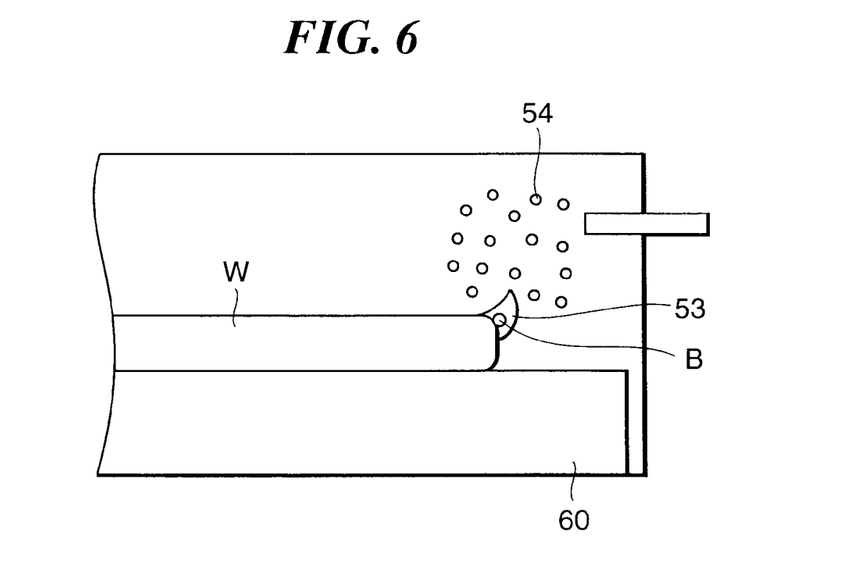
FIG. 6 is a conceptual drawing showing the case that gaseous cyanoacrylate is sprayed onto an ice crystal formed around a bevel polymer B so as to immobilize the ice crystal.

FIG. 6 is a conceptual drawing showing the case that gaseous cyanoacrylate is sprayed onto the ice crystal formed around the bevel polymer B so as to immobilize the ice crystal.

Referring to FIG. 6, cyanoacrylate 54 is sprayed onto the ice crystal 53 that has three-dimensionally grown around the bevel polymer B attached to the peripheral edge of the wafer W mounted on the cooling unit 60. As a result, the ice crystal 53 is turned into solid matter (crystal immobilizing step).

If the ice crystal is continuously cooled, it grows with the passage of time, and if the cooling is stopped, and the ice crystal is left standing, it evaporates and disappears. For this reason, to detect the bevel polymer B based on the ice crystal, it is important to manage the atmosphere around the peripheral edge of the wafer W, but such complicated management of the atmosphere may be dispensed with by carrying out the peripheral edge detecting step after the ice crystal is turned into solid matter.

Although in the present embodiment, the peripheral edge checking unit using the laser light scattering method is used as the apparatus that measures the ice crystal that has grown around the bevel polymer B, there is no intention to limit the present invention to this, but an optical microscope, an electron microscope, or the like may be used.

Although in the above described embodiment, the substrate processing system has the peripheral edge processing unit and the peripheral edge checking unit, the peripheral edge processing unit may be disposed away from the substrate processing system, and also, the peripheral edge checking unit may be disposed away from the substrate processing system. Further, the peripheral edge checking unit disposed away from the substrate processing system may be provided with the above described component elements of the peripheral edge processing unit.

It should be noted that in the substrate processing system according to the above described embodiment, the substrates of which surfaces are checked are not limited to wafers for semiconductor devices, but rather may instead be any of various substrates used in LCDs (Liquid Crystal Displays), FPDs (Flat Panel Displays), photomasks, CD substrates, printed substrates, or the like.

It is to be understood that the object of the present invention may also be accomplished by supplying a system or an apparatus with a storage medium in which a program code of software, which realizes the functions of the above described embodiment is stored, and causing a computer (or a CPU, an MPU, or the like) of the system or the apparatus to read out and execute the program code stored in the storage medium.

In this case, the program code itself read from the storage medium realizes the functions of the above described embodiment, and hence the program code and the storage medium on which the program code is stored constitute the present invention.

Examples of the storage medium for supplying the program code include a medium capable of storing the above program code, for example, a floppy (registered trademark) disk, a hard disk, a magnetic-optical disk, an optical disk such as a CD-ROM, a CD-R, a CD-RW, a DVD-ROM, a DVD-RAM, a DVD-RW, or a DVD+RW, a magnetic tape, a non-volatile memory card, and a ROM. Alternatively, the program code may be supplied by downloading via a network.

Further, it is to be understood that the functions of the above described embodiment may be accomplished not only by executing a program code read out by a computer, but also by causing an OS (operating system) or the like which operates on the computer to perform a part or all of the actual operations based on instructions of the program code.

Further, it is to be understood that the functions of the above described embodiment may be accomplished by writing a program code read out from the storage medium into a memory provided in an expansion board inserted into a computer or a memory provided in an expansion unit connected to the computer and then causing a CPU or the like provided in the expansion board or the expansion unit to perform a part or all of the actual operations based on instructions of the program code.

What is claimed is:

1. A foreign matter detecting method of detecting foreign matter attached to a peripheral edge of a substrate, comprising:
    a cooling step of cooling the substrate to condense moisture around foreign matter attached to the peripheral edge of the substrate, and then icing the condensed moisture to grow an ice crystal; and
    a peripheral edge checking step of detecting the foreign matter attached to the peripheral edge of the substrate, which is emphasized by the ice crystal.

2. A foreign matter detecting method of detecting foreign matter attached to a peripheral edge of a substrate as claimed in claim 1, wherein said cooling step comprises cooling the peripheral edge of the substrate to −15° C. or less, and controlling a relative humidity in an atmosphere surrounding the peripheral edge of the substrate at 23° C. to 10% or less.

3. A foreign matter detecting method of detecting foreign matter attached to a peripheral edge of a substrate as claimed in claim 1, wherein said cooling step comprises maintaining the moisture in a supercooled state, and providing control such that a water vapor pressure in an atmosphere surrounding the peripheral edge of the substrate is not more than a saturated vapor pressure at which moisture in a vapor phase condenses on the peripheral edge of the substrate even if no foreign matter is attached to the peripheral edge of the substrate, and not less than a saturated vapor pressure at which moisture in a vapor phase condenses on the peripheral edge of the substrate if foreign matter is attached to the peripheral edge of the substrate.

4. A foreign matter detecting method of detecting foreign matter attached to a peripheral edge of a substrate as claimed in claim 1, wherein the ice crystal undergoes a vapor-phase growth.

5. A foreign matter detecting method of detecting foreign matter attached to a peripheral edge of a substrate as claimed in claim 1, comprising an ice crystal immobilizing step of, prior to said peripheral edge checking step, causing a component that reacts with water molecules and becomes solidified to act on the ice crystal so that the ice crystal is immobilized.

* * * * *